(12) United States Patent
Hsu et al.

(10) Patent No.: US 8,420,523 B2
(45) Date of Patent: Apr. 16, 2013

(54) CHIP PACKAGING METHOD AND STRUCTURE THEREOF

(75) Inventors: Cheng-Ho Hsu, Miao-Li (TW); Kuei Pin Wan, Miao-Li (TW)

(73) Assignee: Kun Yuan Technology Co., Ltd. (TW)

( * ) Notice: Subject to any disclaimer, the term of this patent is extended or adjusted under 35 U.S.C. 154(b) by 0 days.

(21) Appl. No.: 13/307,647

(22) Filed: Nov. 30, 2011

(65) Prior Publication Data

US 2012/0070943 A1 Mar. 22, 2012

Related U.S. Application Data

(62) Division of application No. 12/585,323, filed on Sep. 11, 2009, now abandoned.

(30) Foreign Application Priority Data

Jun. 15, 2009 (TW) .............................. 98119896 A

(51) Int. Cl.
*H01L 21/44* (2006.01)

(52) U.S. Cl.
USPC ................................. 438/617; 257/E21.504

(58) Field of Classification Search .......... 438/113–114, 438/118, 117, 127, 612–618; 257/E21.504, 257/777, 685–686, 693, 778–784, 787
See application file for complete search history.

(56) References Cited

U.S. PATENT DOCUMENTS 7,808,093 B2 * 10/2010 Kagaya et al. ................ 257/686

* cited by examiner

*Primary Examiner* — Hoa B Trinh
(74) *Attorney, Agent, or Firm* — Bacon & Thomas, PLLC

(57) ABSTRACT

The present invention relates to a chip packaging method and structure, in which bonding pads provided on the chip are connected by a plurality of metal wires via bonding, each of the metal wires is bending in the middle part to be higher than a predetermined height, and its ends are respectively electrically connected with two of the bonding pads. A molding layer is packaged on the chip and the molding layer is higher than the predetermined height. The molding layer is sliced at the predetermined height. Two upper breakpoints of each metal wire are exposed and a substrate is attached onto the molding layer. A plurality of circuit contacts of the substrate are respectively electrically coupled with the upper breakpoints. Whereby, the invention is capable of reducing the length of the metal wires in order to improve transmission speed, but also to reduce the volume of the packaging structure.

6 Claims, 5 Drawing Sheets

CHIP PACKAGING METHOD AND STRUCTURE THEREOF

This application is a divisional of application of pending U.S. patent application Ser. No. 12/585,323, filed Sep. 11, 2009 (of which the entire disclosure of the pending, prior application is hereby incorporated by reference).

BACKGROUND OF THE INVENTION

1. Field of the Invention

The present invention relates to a chip packaging method and structure and, more particularly, to a packaging method and structure for use in inverting a chip in a semiconductor packaging process.

2. Description of Related Art

Please refer to FIG. 1. FIG. 1 is a cross-sectional diagram of a conventional chip packaging body 9. A commonly known conventional method for packaging a chip is as follows: firstly, attaching a chip 91 onto a substrate 93 disposed in advance with circuits and a plurality of connecting pads 931, then bonding golden wires 92 to electrically connect contacts 911 on the chip 91 with the plurality of connecting pads 931 on the substrate 93, finally packaging a molding layer 94.

However, the approach of bonding golden wires 92 in the packaging method of the existing technology is as follows: bonding out from the contacts 911 on the chip 91 and connecting downward with the connecting pads 931 on the substrate 93 when attaining a particular height. Such an approach results is too long in length of the connecting golden wires 92, rendering waste of cost of the golden wires 92. And more importantly, the longer the connecting golden wires 92, the larger the signal loss or the higher the noise produced, when requiring the chip packaging body 9 of high transmission speed, in particular the analog signal chip.

Therefore, it is desirable to provide an improved chip packaging method and structure so as to raise the transmission speed of the chip packaging body, save cost of the golden wires, reduce the volume of the chip packaging body and to allow the chip in the packaging body to be in a better protection state.

SUMMARY OF THE INVENTION

An object of the present invention is to provide a chip packaging method, comprising the following steps:

(A) providing a chip, a plurality of bonding pads being provided on an upper surface thereof; (B) connecting out a plurality of metal wires via bonding, in which a middle part of each of the plurality of metal wires is bent to be higher than a predetermined height, and two ends of each of the plurality of metal wires are respectively electrically connected to two of the plurality of bonding pads; (C) packing a molding layer on the chip to cover at least a part of the plurality of metal wires, the molding layer being higher than the predetermined height; (D) slicing the molding layer from the place of the predetermined height and cutting out the plurality of metal wires to expose two upper breakpoints of each of the plurality of metal wires; and (E) attaching a substrate, disposed in advance with a plurality of circuit contacts, onto the molding layer, wherein the plurality of circuit contacts are correspondingly electrically coupled to the upper breakpoints of the plurality of metal wires, respectively. Thus, according to the manufacturing method of the invention, it is capable of shortening the length of the metal wires in the internal part of the chip packaging structure so as to raise the transmission speed, save cost, and reduce the volume of the chip packaging body.

The manufacturing method of the invention further comprises a step (D1) after the step (D), i.e. forming a plurality of metal pads on the molding layer, the plurality of metal pads being respectively corresponding to the upper breakpoints of the plurality of metal wires, wherein in the step (E), the plurality of circuit contacts of the substrate are respectively electrically connected to the upper breakpoints of the plurality of metal wires through the plurality of metal pads. The metal pads of the invention not only can enlarge the electrically contacting size, but also can provide attaching the substrate to the molding layer. In addition, the step in (D1) of forming a plurality of metal pads on the molding layer includes formation by way of passing a tin slot.

Preferably, in the step (A) of the invention, a lower surface of the chip is mounted on a carrier board. Functionally, the carrier board is able to facilitate the proceeding of the packaging process, other than protecting the chip. Further, the step in (D) of slicing the molding layer is at least selected from a group formed by laser cutting, diamond knife cutting and grinding wheel cutting. Furthermore, the invention further comprises a step (F) after the step (E), i.e. forming a plurality of ball pads on the upper surface of the substrate, the plurality of ball pads being respectively electrically coupled to the plurality of circuit contacts. That is, the packaging structure of the invention may be a packaging structure of a ball grid array.

A further object of the present invention is to provide a chip packaging structure, comprising a chip, at least a metal wire, a molding layer and a substrate. The chip includes an upper surface and a lower surface, the upper surface being provided with at least a bonding pad The at least a metal wire includes a first end and a second end, the first end being electrically connected to the at least a bonding pad of the chip. The molding layer is packaged to cover the chip and the at least a metal wire, the second end of the at least a metal wire being exposed to an upper surface of the molding layer. The substrate is attached onto the upper surface of the molding layer, a lower surface of the substrate including at least a circuit contact, which is correspondingly electrically coupled to the second end of the at least a metal wire. Thus, the chip packaging structure of the invention is capable of shortening the length of the metal wires in the internal part of the chip packaging structure so as to raise the transmission speed, save cost of the metal wires, and reduce the volume of the chip packaging body.

In addition, the chip packaging structure of the invention further comprises a carrier board, the lower surface of the chip being mounted on the carrier board. Functionally, the carrier board is able to facilitate the proceeding of the packaging process, other than protecting the chip. The chip packaging structure of the invention further comprises a fastening layer for fastening between the lower surface of the chip and the carrier board. The fastening layer is mainly for use in attaching the chip onto the carrier board. Further, in the chip packaging structure of the invention, the upper surface of the molding layer further comprises at least a metal pad, and the at least a circuit contact of the substrate is electrically connected to the second end of the at least a metal wire through the at least a metal pad. The metal pad of the invention not only can enlarge the size of the electrical contacting, but also can provide attaching the substrate to the molding layer. The at least a metal pad includes a tin-plated pad.

Furthermore, in the chip packaging structure of the invention, the lower surface of the substrate is further convexly provided with at least a leg pad, and the at least a circuit contact is electrically connected to the second end of the at least a metal wire through the at least a leg pad. The leg pad of the invention is mainly for use in enlarging the electrically contacting size. In addition, the invention further comprises an attaching layer, which is attached between the upper surface of the molding layer and the lower surface of the substrate, while not overlaying the at least a leg pad. The attaching layer is mainly to attach the molding layer and the substrate. Preferably, the upper surface of the substrate further comprises at least a ball pad, which is electrically coupled to the at least a circuit contact. That is, the packaging structure of the invention may be a packaging structure of a ball grid array.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
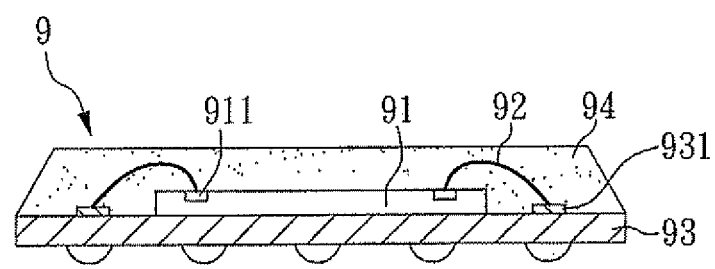
FIG. 1 is a cross-sectional diagram of a conventional chip packaging structure.
Figure 2A:
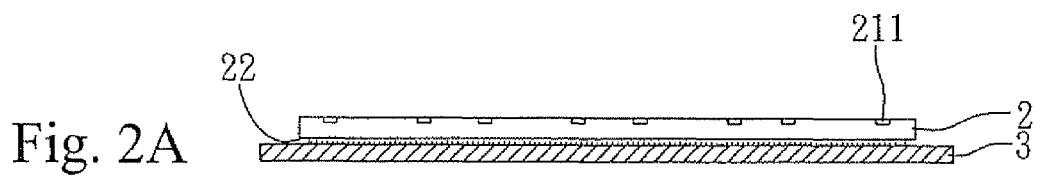
FIGS. 2A-2F are cross-sectional diagrams of a preferred embodiment of the invention.
Figure 2B:
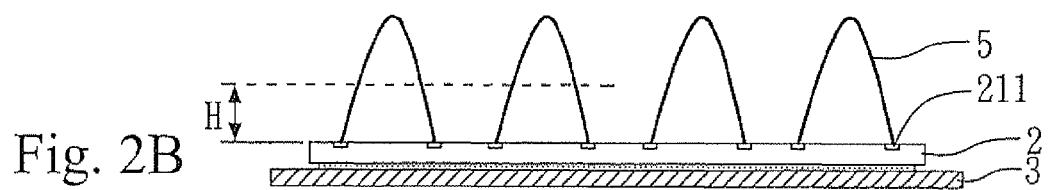
Figure 2C:
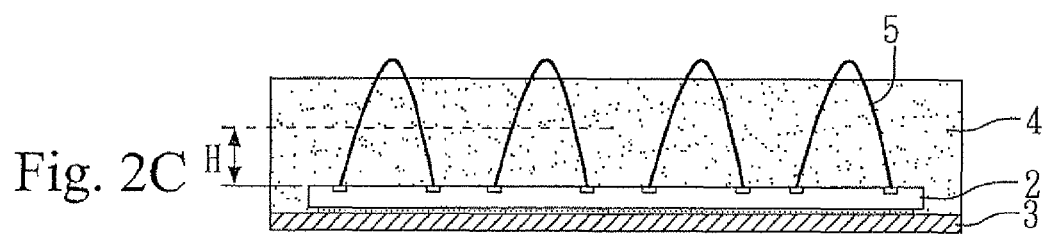
Figure 2D:
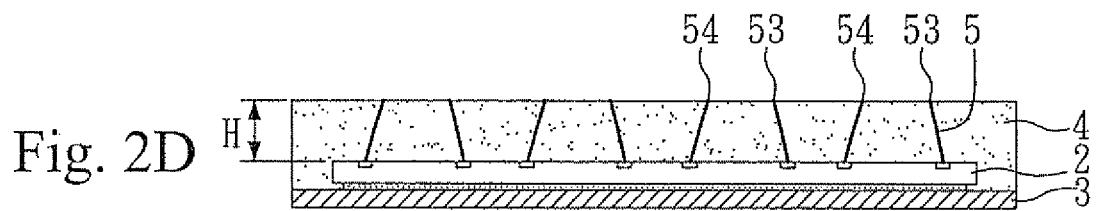
Figure 2E:
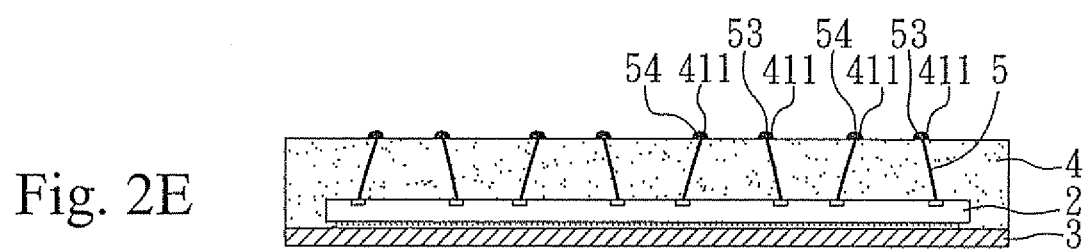
Figure 2F:
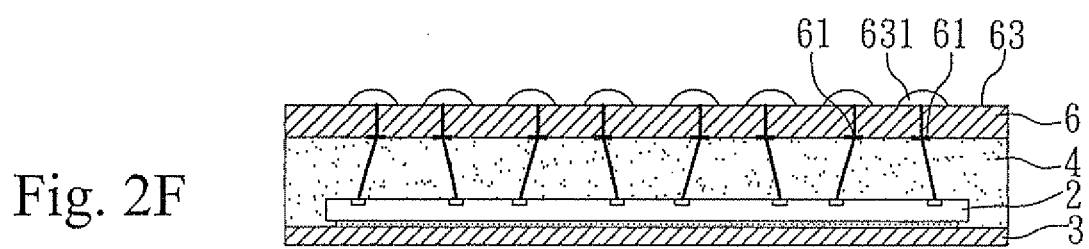
Figure 3:
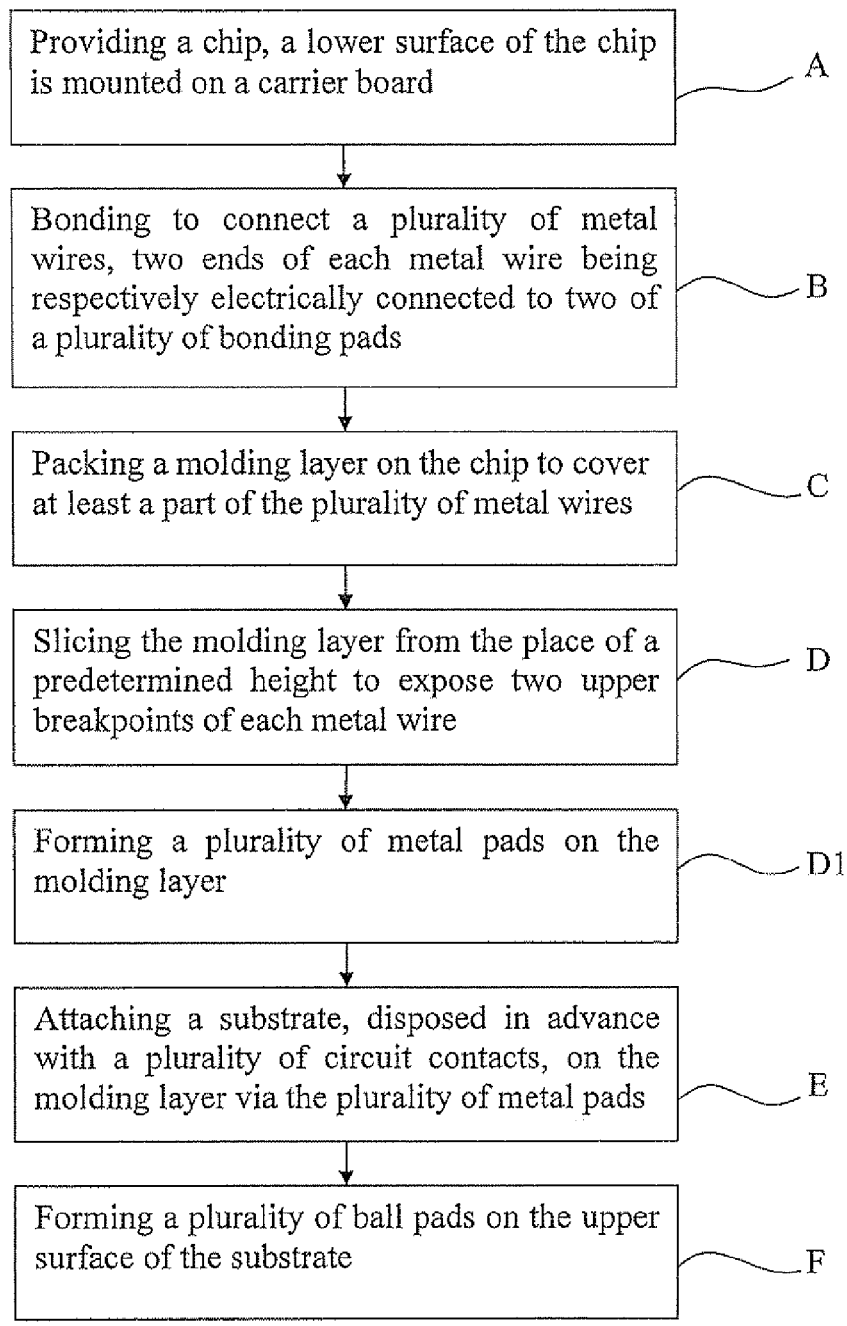
FIG. 3 is a flow chart of a preferred embodiment of the invention.

Please refer to FIGS. 2A to 2F together with FIG. 3. FIGS. 2A-2F are cross-sectional diagrams of each step for a chip packaging method of a preferred embodiment of the invention, and FIG. 3 is a flow chart of a preferred embodiment of the invention. Firstly, as shown in FIG. 2A, a chip 2 is provided, a plurality of bonding pads 211 are provided on an upper surface 21 thereof and a lower surface 22 of the chip 2 is mounted on a carrier board 3 (step A in FIG. 3). However, the carrier board 3 may be added in dependence of the condition or need and is mainly used for protecting the chip 2, while facilitating the proceeding of the packaging process.

Next, as shown in FIG. 2B, a plurality of metal wires 5 are connected out via bonding (step B in FIG. 3), and a middle part of each of the plurality of metal wires 5 is bent to be higher than a predetermined height H, in which two ends of each of the plurality of metal wires 5 are respectively electrically connected to two of the plurality of bonding pads 211. That is, each of the two of the plurality of bonding pads 211 provided on the upper surface 21 of the chip 2 is electrically connected via one of the plurality of metal wires 5 and each of the plurality of metal wires 5 is extending upward to be higher than a predetermined height H and bent in a middle part. After that, as shown in FIG. 2C, a molding layer 4 is packed on the chip 2 to cover at least a part of the plurality of metal wires 5, in which the molding layer 4 is higher than the predetermined height H (step C in FIG. 3).

Further, as shown in FIG. 2D, the molding layer 4 is sliced from the place of the predetermined height H and the plurality of metal wires 5 are cut out simultaneously to expose two upper breakpoints 53,54 of each of the plurality of metal wires 5 (step D in FIG. 3). In the embodiment, it is performed by diamond knife cutting. Of course, laser cutting or grinding wheel cutting may be used as well. Later, as shown in FIG. 2E, a plurality of metal pads 411 are formed on the molding layer 4 (step D1 in FIG. 3), in which the plurality of metal pads 411 are respectively corresponding to the upper breakpoints 53,54 of the plurality of metal wires 5. In the embodiment, forming a plurality of metal pads 411 may be processed by way of passing a tin slot.

And then, as shown in FIG. 2F, a substrate 6, disposed in advance with a plurality of circuit contacts 61, is attached onto the molding layer 4 (step E in FIG. 3), in which the plurality of circuit contacts 61 are respectively electrically coupled to the upper breakpoints 53,54 of the plurality of metal wires 5 through the plurality of metal pads 411. In the mean time, by way of overlaying the plurality of metal pads 411, just passing through a tin slot and being in a melted state, directly onto the substrate 6 and the molding layer 4, the effect of attaching is produced after cooling and curing.

Based on this, the metal pads 411 of the embodiment are mainly used not only to enlarge the electrically contacting size and avoid that the metal wires 5 are too thin to correspondingly electrical contact with the circuit contacts 61, but also to provide attaching the substrate 6 to the molding layer 4. Lastly, a plurality of ball pads 631 are formed on the upper surface 63 of the substrate 6, in which the plurality of ball pads 631 are respectively electrically coupled to the plurality of circuit contacts 61 (step F in FIG. 3). That is, the packaging structure of the embodiment is a packaging structure of a ball grid array.

Figure 4:
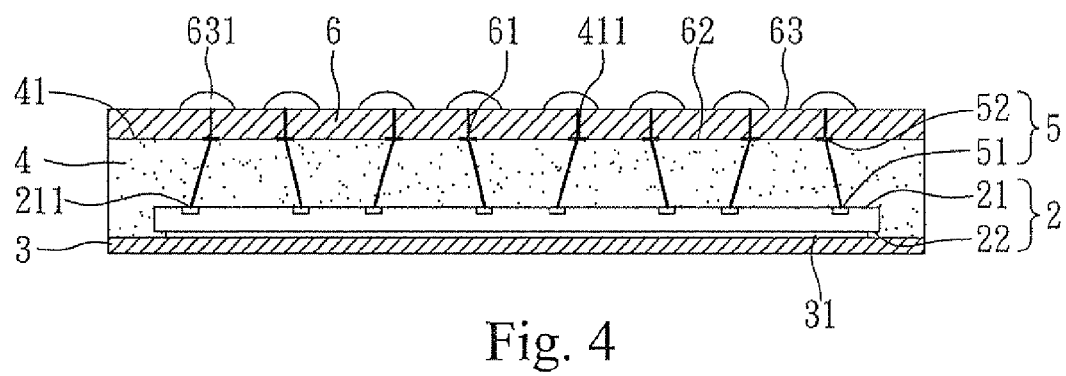
FIG. 4 is a cross-sectional diagram of a first preferred embodiment of the invention.

Please refer to FIG. 4. FIG. 4 is a cross-sectional diagram of a first preferred embodiment of the invention. As shown, the invention comprises a chip 2, including an upper surface 21 and a lower surface 22, in which the upper surface 21 are provided with a plurality of bonding pads 211. The lower surface 22 are provided with a carrier board 3, in which the lower surface 22 of the chip 2 is mounted on the carrier board 3 through a fastening layer 31. The carrier board 3 is mainly used to protect the chip 2, while facilitating the proceeding of the whole packaging process. In addition, the drawing shows a plurality of metal wires 5 and each of the plurality of metal wires 5 includes a first end 51 and a second end 52, in which the first end 51 of each metal wire 5 is electrically connected to a bonding pad 211 of the chip 2.

Further, FIG. 4 shows a molding layer 4, which is packaged to cover the chip 2 and the plurality of metal wires 5. Moreover, the second end 52 of each metal wire 5 is exposed to an upper surface 41 of the molding layer 4. The upper surface 41 of the molding layer 4 further comprises a plurality of metal pads 411, and each of the plurality of metal pads 411 is electrically connected to the second end 52 of the metal wire 5. In this embodiment, each of the plurality of metal pads 411 is a tin-plated pad, which may be formed by passing through a tin slot. On the other hand, the substrate 6 is attached onto the upper surface 41 of the molding layer 4, which is processed through attaching of the Metal pads 411 in a melted state and then curing and fastening after cooling according to this embodiment.

In addition, a lower surface 62 of the substrate 6 includes a plurality of circuit contacts 61 and each of the plurality of circuit contacts 61 is correspondingly electrically coupled to the second end 52 of the metal wire 5. Thus, the metal pads 411 of the embodiment not only can enlarge the contacting size of the electrical coupling, but also can provide the attaching effect, i.e. fastening the substrate 6 onto the molding layer 4. Still further, the drawing shows that the upper surface 63 of the substrate 6 further comprises a plurality of ball pads 631 and each of the plurality of ball pads 631 is electrically coupled to one circuit contact 61. That is, the packaging structure of the embodiment may be a packaging structure of a ball grid array.

Figure 5:
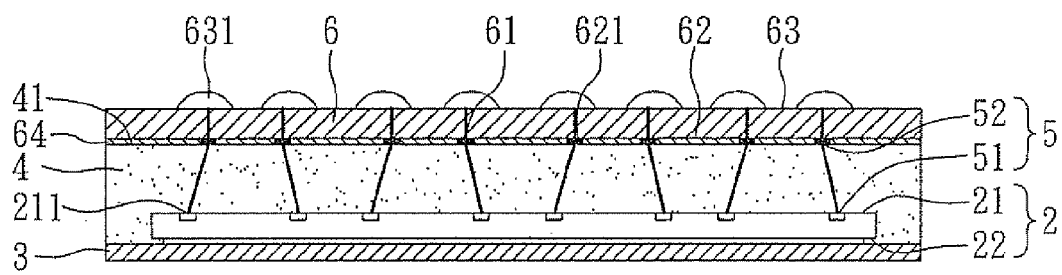
FIG. 5 is a cross-sectional diagram of a second preferred embodiment of the invention.

Please refer to FIG. 5. FIG. 5 is a cross-sectional diagram of a chip packaging structure a second preferred embodiment of the invention, This embodiment mainly differs from the first preferred embodiment in that in this embodiment, the lower surface 62 of the substrate 6 is convexly provided with a plurality of leg pads, and each circuit contact 61 is electrically connected to the second end 52 of one metal wire 5 through one leg pad 621. In addition, an attaching layer 64 is additionally painted to attach the substrate 6 onto the molding layer 4, in which the attaching layer 64 is attached between the upper surface of the molding layer 4 and the lower surface 62 of the substrate 6, while not overlaying the plurality of leg pads 621.

Although the present invention has been explained in relation to its preferred embodiment, it is to be understood that many other possible modifications and variations can be made without departing from the scope of the invention as hereinafter claimed.

What is claimed is:

1. A chip packaging method, comprising the following steps:
   (A) providing a chip, a plurality of bonding pads being provided on an upper surface thereof;
   (B) connecting out a plurality of metal wires via bonding, in which a middle part of each of the plurality of metal wires is bent to be higher than a predetermined height, and two ends of each of the plurality of metal wires are respectively electrically connected to two of the plurality of bonding pads;
   (C) packing a molding layer on the chip to cover at least a part of the plurality of metal wires, the molding layer being higher than the predetermined height;
   (D) slicing the molding layer from the place of the predetermined height and cutting out the plurality of metal wires to expose two upper breakpoints of each of the plurality of metal wires; and
   (E) attaching a substrate, disposed in advance with a plurality of circuit contacts, onto the molding layer, wherein the plurality of circuit contacts are correspondingly electrically coupled to the upper breakpoints of the plurality of metal wires, respectively.

2. The chip packaging method as claimed in claim 1, wherein in the step (A), a lower surface of the chip is mounted on a carrier board.

3. The chip packaging method as claimed in claim 1, further comprising a step after the step (D):
   (D1) forming a plurality of metal pads on the molding layer, the plurality of metal pads being respectively corresponding to the upper breakpoints of the plurality of metal wires;
   wherein in the step (E), the plurality of circuit contacts of the substrate are respectively electrically connected to the upper breakpoints of the plurality of metal wires through the plurality of metal pads.

4. The chip packaging method as claimed in claim 3, wherein the step in (D1) of forming a plurality of metal pads on the molding layer includes formation by way of passing a tin slot.

5. The chip packaging method as claimed in claim 1, wherein the step in (D) of slicing the molding layer is at least selected from a group formed by laser cutting, diamond knife cutting and grinding wheel cutting.

6. The chip packaging method as claimed in claim 1, further comprising a step after the step (E):
   (F) forming a plurality of ball pads on the upper surface of the substrate, the plurality of ball pads being respectively electrically coupled to the plurality of circuit contacts.

* * * * *